(12) United States Patent
Vashchenko

(10) Patent No.: US 8,564,062 B2
(45) Date of Patent: Oct. 22, 2013

(54) HIGH VOLTAGE MOS ARRAY WITH GATE CONTACT ON EXTENDED DRAIN REGION

(75) Inventor: Vladislav Vashchenko, Palo Alto, CA (US)

(73) Assignee: National Semiconductor Corporation, Santa Clara, CA (US)

(*) Notice: Subject to any disclaimer, the term of this patent is extended or adjusted under 35 U.S.C. 154(b) by 993 days.

(21) Appl. No.: 12/214,390

(22) Filed: Jun. 18, 2008

(65) Prior Publication Data

US 2009/0315110 A1    Dec. 24, 2009

(51) Int. Cl.
*H01L 29/78*    (2006.01)
(52) U.S. Cl.
USPC ............... 257/344; 257/327; 257/E29.268; 257/E29.269

(58) Field of Classification Search
USPC ............... 257/344, 327, E29.268, E29.269
See application file for complete search history.

(56) References Cited

U.S. PATENT DOCUMENTS

| 7,005,354 B2* | 2/2006 | Pan et al. ................ 438/286 |
| 2009/0166754 A1* | 7/2009 | Webb et al. ................ 257/382 |

* cited by examiner

*Primary Examiner* — Long Pham
(74) *Attorney, Agent, or Firm* — Eugene C. Conser; Wade J. Brady, III; Frederick J. Telecky, Jr.

(57) ABSTRACT

In an extended drain MOS device used in high voltage applications, switching characteristics are improved by providing for at least one base contact in the active region in the extended drain space.

10 Claims, 2 Drawing Sheets

HIGH VOLTAGE MOS ARRAY WITH GATE CONTACT ON EXTENDED DRAIN REGION

FIELD OF THE INVENTION

The invention relates to high voltage devices. In particular it relates to power arrays of high voltage MOS devices.

BACKGROUND OF THE INVENTION

Power arrays of high voltage devices are commonly used in dc-dc converters. These high voltage devices are, for instance, implemented as Lateral DMOS (LDMOS) (which is a self-aligned device implemented in a BiCMOS process) or as drain-extended MOS (DeMOS) (which is a non-self-aligned device implemented in a CMOS process). FIG. 1 shows a cross section through a typical N-LDMOS-SCR 100, which broadly speaking comprises an LDMOS having a p+ region 102 with contact 103 to provide for double injection of charge carriers. The device 100 also includes an n+ drain 104 with an extended drain region 106 in the form of an n-drift region. As is evident from FIG. 1, the drain 104 is formed in the n-drift 106, which, in turn is formed in an n-epitaxial region 110. However a p-well 112 is also formed in the n-epi 110 with the result that the n-drift 106 extends into the p-well 112. The device 100 further includes an n+ source 114 formed in a p-body 116, which is formed in the p-well 112. The p+ region 102 is, in turn, formed in a p-field region 120 that is formed in the p-body 116. A polysilicon gate 122 is provided between the drain contact 130 and source contact 132, this region between the contacts defining the active region. The poly gate 122 is separated from the silicon by an oxide layer 124, and a poly section 126 extends over the n-drift 106, being isolated from the n-drift 106 by the oxide 124.

For a better appreciation of the layout of the drain, source and gate, and especially the drain, source and gate contacts, FIG. 2 shows the NLDMOS-SCR in plan view.

It will be appreciated that in all of these extended drain devices a small footprint and good switching characteristics are an important consideration.

However, in both LDMOS and DeMOS arrays, the topology involves multiple fingers with the gates connected at the sides of the array outside the active region. In the case of non-silicided processes this creates a distributed capacitive-resistive network which negatively impacts the switching characteristics. Also, the gate connection area (indicated in FIG. 2 by reference numeral 200) requires additional space.

SUMMARY OF THE INVENTION

According to the invention, there is provided a high voltage BiCMOS or CMOS device comprising at least one drain with an extended non-silicided drain region, at least one source and at least one polysilicon gate with at least one gate contact to the polysilicon gate located in the active region between the drain and source. The at least one gate contact is preferably located in the extended drain space over the extended drain region.

Further, according to the invention, there is provided a high voltage power array of MOS devices each MOS device comprising a source, a drain with an extended drain region, and a polysilicon gate having at least one gate contact in the active region between the drain and the source. A metal layer may provide the electrical connection to the contacts. The polysilicon gate may be insulated from the drain by a field oxide. The gate preferably includes a plurality of gate contacts arranged along the width of the gate. One or more additional gate contacts may be provided at the sides of the array outside the active region.

DETAILED DESCRIPTION OF THE INVENTION

Figure 3:
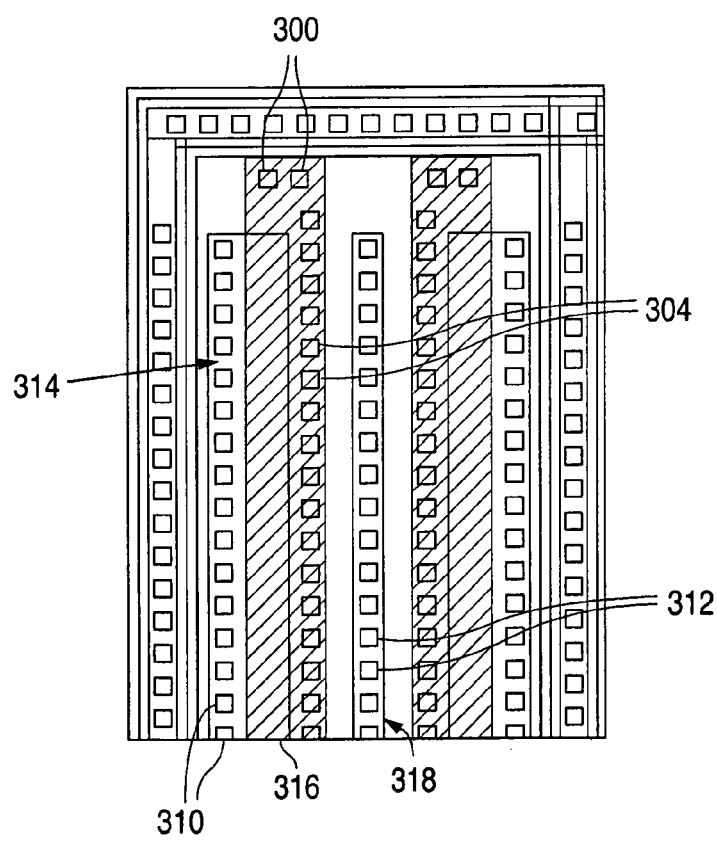
FIG. 3 shows one embodiment of a high voltage MOS array in accordance with the invention in plan view.

FIG. 3 shows a top view of one embodiment of an extended drain array of the invention. In this case an array of NLDMOS-SCR devices modified in accordance with the invention is provided. Instead of simply making use of gate contacts 300 outside the active region 302, the extended drain devices in FIG. 3 include gate contacts 304 connecting to the gate polysilicon in the active region 302 between the drain contacts 310 and source contacts 312 over the extended drain region.

In this embodiment the gate contacts 304 are electrically contacted through trace lines formed from a metal layer.

Figure 2:
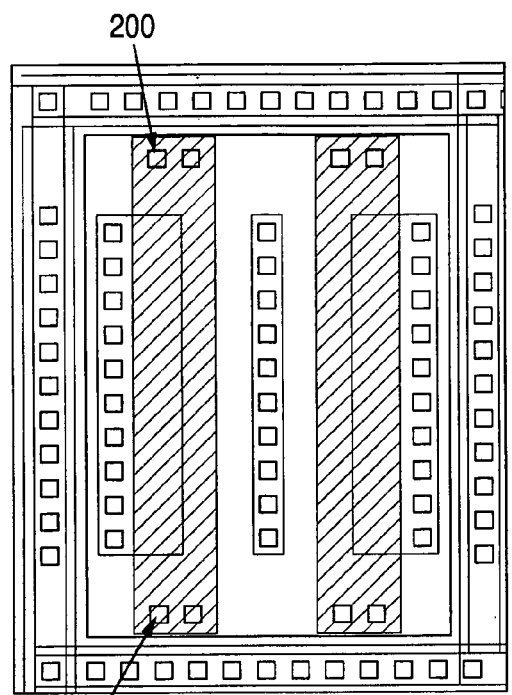
FIG. 2 shows the NLDMOS SCR of FIG. 1 as an array in plan view showing gate contacts outside the active region.

The rest of the structure is similar to that shown in FIG. 2, with the drain contacts 310 contacting the drain 314 with its extended drain region 316, and the source contacts 312 contacting the source 318.

Figure 1:
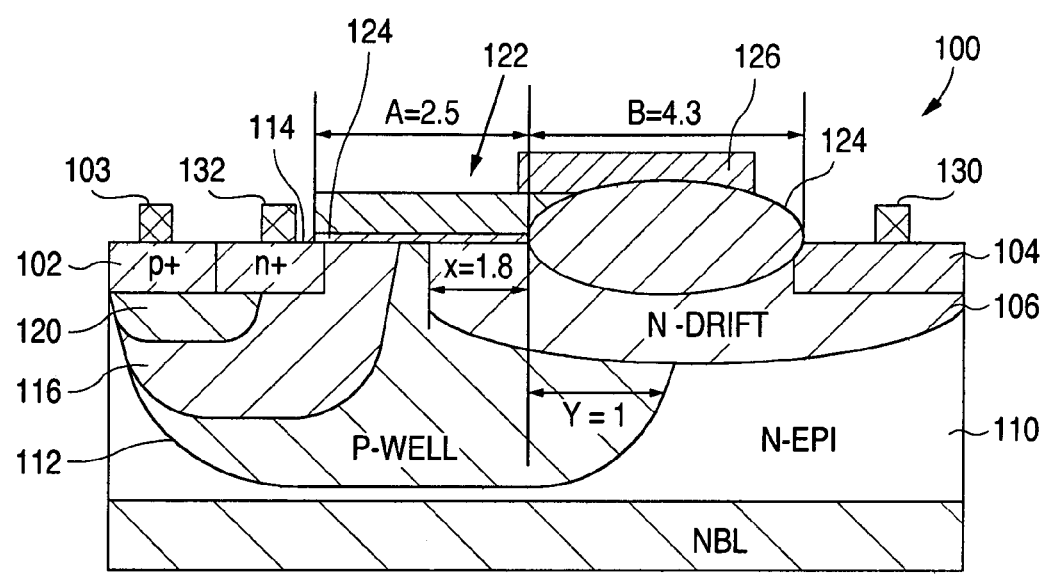
FIG. 1 shows a cross section through a prior art N-LDMOS-SCR device.

In this embodiment the extended drain device is defined by an NLDMOS-SCR like device having a p+ region next to the n+ source 318 formed in a p-well. This can be implemented in a way similar to the p+ region 102 of FIG. 1.

Since in a power array the gate-line forms a distributed RC network, putting the gate contact in the active region over the extended drain region has the effect of introducing additional metal which reduces the resistance especially in non-silicided processes.

The present invention thus has the advantage that it improves the switching characteristics due to the reduction in parasitic resistance in the gate line and thus a reduction in the distributed capacitive-resistive network.

While the embodiment of FIG. 3 includes gate contacts 300 outside the active region, it will be appreciated that this can be avoided altogether. By providing gate contacts in the extended drain region only instead of providing for an additional region gate contact region outside the active region 302 the footprint of the device can be reduced, thus increasing Rdson.

What is claimed is:

1. A high voltage BiCMOS or CMOS device comprising
    at least one drain with an extended non-silicided drain region,
    at least one source,
    at least one polysilicon gate with at least one gate contact to the polysilicon gate located in the active region between the drain and source, and
    a metal layer for providing the electrical connection to the at least one gate contact.

2. A high voltage device of claim 1, wherein the at least one gate contact is located over the extended drain region.

3. A high voltage device of claim 2, wherein the metal layer defines trace lines that connect to the at least one gate contact.

4. A high voltage device of claim 2, wherein the polysilicon gate is insulated from the drain by a field oxide.

5. A high voltage device of claim 2, wherein the gate includes a plurality of gate contacts arranged along the width of the gate.

6. A high voltage device of claim 5, wherein one or more additional gate contacts are provided at the sides of the polysilicon gate outside the active region.

7. A high voltage power array of MOS devices each MOS device comprising,
   a source,
   a drain with an extended drain region,
   a polysilicon gate having at least one gate contact in the active region between the drain and the source,
   wherein the at least one gate contact is located over the extended drain region, and
   a metal layer for providing the electrical connection to the at least one gate contact.

8. A high voltage power array of claim 7, wherein the metal layer defines trace lines that connect to the at least one gate contact.

9. A high voltage power array of claim 7, wherein the polysilicon gate is insulated from the drain by a field oxide,
   also wherein the gate includes a plurality of gate contacts arranged along the width of the gate.

10. A high voltage power array of claim 9, wherein one or more additional gate contacts are provided at the sides of the polysilicon gate outside the active region.

* * * * *